United States Patent [19]

Sickafus et al.

[11] Patent Number: 4,808,260

[45] Date of Patent: Feb. 28, 1989

[54] DIRECTIONAL APERTURE ETCHED IN SILICON

[75] Inventors: Edward N. Sickafus, Grosse Ile; Mati Mikkor, Ann Arbor, both of Mich.

[73] Assignee: Ford Motor Company, Dearborn, Mich.

[21] Appl. No.: 152,718

[22] Filed: Feb. 5, 1988

[51] Int. Cl.$^4$ ............................................... C23F 1/00
[52] U.S. Cl. ..................... 156/644; 156/647; 156/654; 156/657; 156/662
[58] Field of Search .............. 156/644, 647, 662, 654, 156/657

[56] References Cited

U.S. PATENT DOCUMENTS

| | | | |
|---|---|---|---|
| 3,977,071 | 8/1976 | Jarman | 156/647 |
| 4,169,008 | 9/1979 | Kurth . | |
| 4,269,653 | 5/1981 | Wada et al. . | |
| 4,514,896 | 5/1985 | Dixon et al. | 156/644 |
| 4,628,576 | 12/1986 | Giachino et al. . | |
| 4,647,013 | 3/1987 | Giachino et al. . | |
| 4,733,823 | 3/1988 | Waggener et al. | 156/647 |
| 4,758,368 | 7/1988 | Thompson | 156/647 |
| 4,765,864 | 8/1988 | Holland et al. | 156/644 |

OTHER PUBLICATIONS

IBM Tech. Dis. Bulletin, "High Density Josephson Board Tech. Using Two-Sided Etching", vol. 22, No. 12, 1980, pp. 5558-5560.

IEEE Transactions on Elect. Devices, "Fabrication of Novel . . . (100) and (110) Silicon", vol. ED-25, No. 10, 10/78.

IBM Technical Disclosure Bulletin, vol. 14, No. 2, Jul. 1971, pp. 417-418, "Fabricating Shaped Grid and Aperture Holes".

Primary Examiner—David L. Lacey
Assistant Examiner—Lori-Ann Johnson
Attorney, Agent, or Firm—Allan J. Lippa; Peter Abolins

[57] ABSTRACT

A method for anisotropically etching an aperture into a monocrystaline substrate such that the angle of the aperture plane with respect to the nominal crystaline planes of the substrate may be preselected. Etchant pits through opposing planar surfaces are offset from one another by a preselected longitudinal offset trigonometrically related to the desired aperture angle. Other selected parameters trigonometrically related to the aperture plane include: the intersecting angle of the intersecting crystaline planes with the nominal crystaline planes; substrate thickness; and depth of each of the etchant pits.

15 Claims, 3 Drawing Sheets

DIRECTIONAL APERTURE ETCHED IN SILICON

BACKGROUND OF THE INVENTION

The field of the invention relates to etching apertures in monocrystaline substrates such as silicon.

It is known to etch apertures in silicon substrates by etchant processes commonly referred to as micromachining. These apertures have been used in optics and also as fluid flow nozzles. Examples of these apertures are enumerated below.

U.S. Pat. No. 4,269,653, issued to Wada et al discloses an aperture etched through silicon for use as an electron beam exposure device. The resulting aperture axis is perpendicular to the nominal plane of the silicon substrate.

U.S. Pat. Nos. 4,628,576 and 4,647,013, both issued to Giachino et al, disclose apertures etched through silicon for use as the nozzle portion of a fuel injector valve. Again, the aperture axis is perpendicular to the nominal plane of the substrate through which the aperture is etched.

IBM Technical Disclosure Bulletin, Volume 14, No. 2, July 1971, Pages 417-418, entitled "Fabricating Shaped Grid and Aperture Holes", discloses a method for etching an array of apertures for use as illumination apertures. More specifically, a silicon substrate is shown having an epitaxial layer grown thereon. A desired array or pattern of apertures is etched through the epitaxial layer. An etchant which attacks the silicon substrate, but not the epitaxial layer, is then used to etch the substrate off from the backside thereby exposing the epitaxial layer and the pattern of apertures etched therethrough. Each aperture has an aperture axis perpendicular to the epitaxial layer.

U.S. Pat. No. 4,169,008 discloses a method of etching apertures for use as nozzles in ink-jet printers. Etchant pits in both the top and bottom surfaces form an opening having an aperture axis perpendicular to the nominal plane of the wafer. By etching from the bottom side, it it alleged that variations in the aperture openings are avoided which would otherwise occur due to variations in the wafer thickness. Stated another way, the dimensions of the openings in the bottom planar surface are determined by the bottom mask openings, rather than by the intersection of the top etchant pit with the bottom planar surface. Each aperture axis is perpendicular to the nominal plane of the substrate.

A problem with the above approaches is that the angle of the aperture plane is not selectable. The aperture axis is constrained to a direction perpendicular to the nominal plane of the substrate. Additional structure is needed to direct the fluid flow in a direction other than perpendicular to the substrate plane which may be desired for a particular application.

SUMMARY OF THE INVENTION

It is therefore an object of the present invention to provide a method for etching apertures from a single monocrystaline substrate wherein the angle of the aperture plane may be preselected.

The above stated problems and other problems of prior approaches are overcome, and object achieved, by the method provided herein for etching apertures into a monocrystaline substrate such that the angle of the aperture plane with respect to the nominal plane of the substrate may be preselected. More specifically, in one aspect of the invention, the method includes the steps of: dimensioning the substrate with top and bottom planar surfaces substantially parallel to the nominal crystaline planes, the spacing between the top and bottom planar surfaces being trigonometrically related to the preselected angle of the aperture plane; anisotropically etching a first etchant pit through the top planar surface and against the nominal crystaline planes to a preselected distance from the bottom planar surface which is trigonometrically related to the preselected angle of the aperture plane, the first etchant pit having plane surface sides along intersecting crystaline planes to the nominal crystaline planes, the intersection of the plane surface sides with the top planar surface defining a first pair of longitudinal edges and a first pair of transverse edges of the first etchant pit; and anisotropically etching a second etchant pit through the bottom planar surface and against the nominal crystaline planes to a preselected distance from the top planar surface which is trigonometrically related to the preselected angle of the aperture plane, a portion of the second etchant pit intersecting a portion of the first etchant pit to define the aperture, the second etchant pit having plane surface sides along the intersecting crystaline planes, the intersection of the plane surface sides with the bottom planar surface defining a second pair of longitudinal edges and a second pair of transverse edges of the second etchant pit, one of the second pair of transverse edges being longitudinally offset from an opposing one of the first pair of transverse edges by a preselected longitudinal offset trigonometrically related to the angle of said aperture plane.

Preferably, the preselected angle is related to the preselected longitudinal offset ($\Delta L$), the preselected distance of the first etchant pit ($d_1$) from the second planar surface, the preselected distance of the second etchant pit ($d_2$) from the first planar surface, the angle between the intersecting planes and the nominal plane ($\phi$), and the thickness of the substrate ($t$) by the following trigonometric relation:

$$\tan^{-1}\left[\frac{t - (d_1 + d_2)}{\Delta L - \frac{(d_1 + d_2)}{\tan \phi}}\right]$$

In accordance with the above, an advantage of the invention is that the designer may select any aperture angle desired by appropriate selection of the above described values ($\Delta L$, $d_1$, $d_2$ and the type of monocrystaline material ($\phi$)). Another advantage, is that the desired aperture may require only a single etchant step wherein top and bottom planar surfaces are concurrently etched to the same depth. Still another advantage, is that a directable aperture is formed in only a single substrate whereas multiple substrates were heretofore required. An additional advantage is that multiple apertures may be formed, each having a different aperture axis, in a single substrate.

BRIEF DESCRIPTION OF THE DRAWINGS

The objects and advantages described herein will be more fully understood by reading the description of the preferred embodiment with reference to the drawings wherein.

DESCRIPTION OF THE PREFERRED EMBODIMENT

Figure 1:
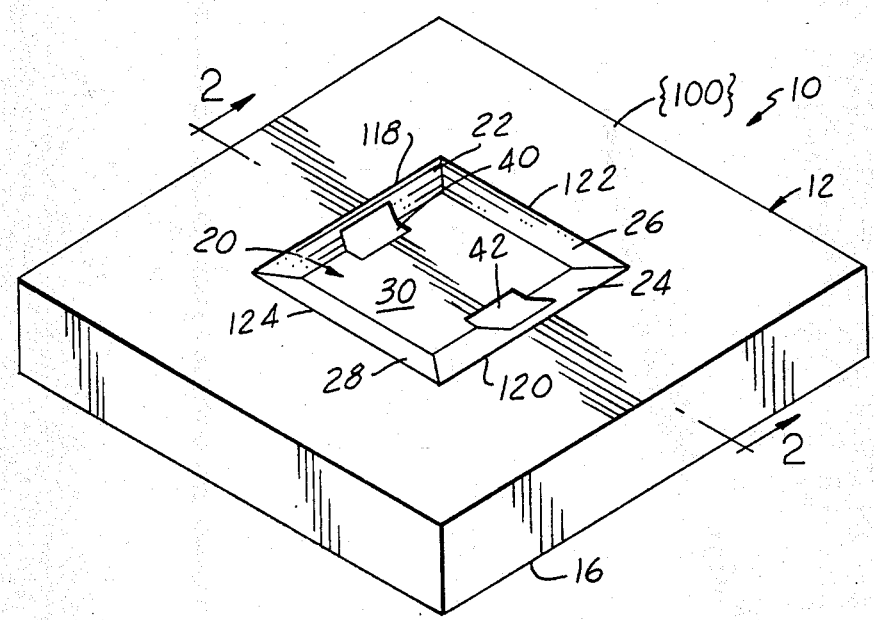
FIG. 1 is a perspective view of an embodiment in which the invention is used to advantage.

Referring first to FIG. 1, aperture assembly 10 is shown for the purposes of illustrating an example in which the invention is used to advantage. Aperture assembly 10 is here shown fabricated from a {100} silicon substrate 12 which has been sawed from a wafer, by conventional means, such that top planar surface 14 and bottom planar surface 16 lie substantially in the {100} nominal crystaline plane. First etchant pit 20 is shown formed through top planar surface 14 with side walls 22, 24, 26, and 28, and bottom wall 30. Side walls 22, 24, 26, and 28 lie in the {111} intersecting planes which intersect the {100} nominal plane at an angle $\phi$ of approximately 54.7°. As shown in more detail later herein with particular reference to FIG. 2, aperture 40 and aperture 42 are symmetrically positioned in substrate 12.

It is to be understood that although a {100} silicon substrate is shown, the invention may be used to advantage with substrates having major surfaces lying in other planar directions such as, for example, {110} silicon. In general, the invention may be used to advantage with any monocrystaline substrate.

Figure 2:
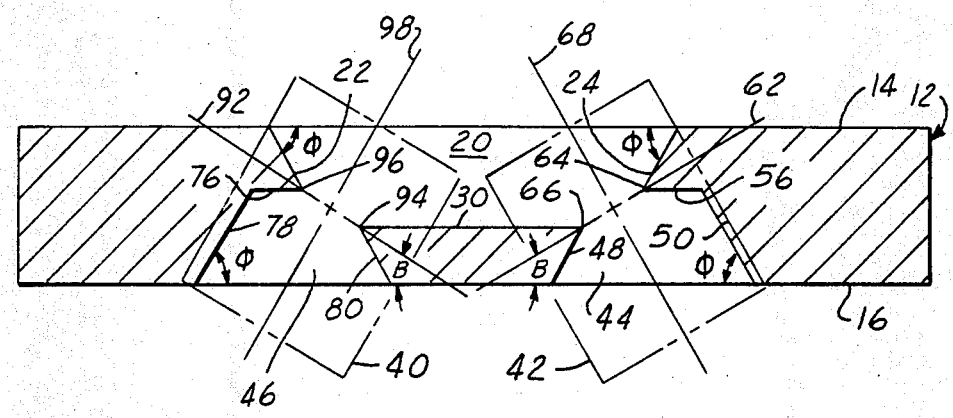
FIG. 2 is a cross-sectional view taken along lines 2—2 of FIG. 1.

Referring now to FIG. 2, aperture 40 and aperture 42 are generally defined by the intersection of top etchant pit 20 with respective bottom etchant pit 44 and bottom etchant pit 46. As described in greater detail later herein with particular reference to FIGS. 3A through 3C, bottom etchant pit 44 is defined by side walls 48, 50, 52 (not shown) and 54 (not shown) lying in the {111} intersecting planes, and top wall 56 lying in the {100} plane. Side walls 48, 50, 52, and 54 are formed at an angle $\phi$ with respect to bottom planar surface 16 or the {100} planes in general.

Aperture plane 62 of aperture 42 is shown in FIG. 2 as a plane between protruding edges 64 and 66 of aperture 42. Protruding edge 64 is defined by the intersection of top etchant pit 20 with top wall 56 of bottom etchant pit 44. Protruding edge 66 is defined by the intersection of bottom etchant pit 44 with bottom wall 30 of top etchant pit 20. Aperture axis 68 of aperture 42 is shown perpendicular to aperture plane 62 midway between protruding edges 64 and 66. The angle of the aperture plane with respect to bottom planar surface 16, or the {100} planes in general, is herein designated as angle $\beta$ which angle is greater than zero degrees.

Aperture 40 is shown in FIG. 2 as being symmetrically formed in substrate 12 with respect to aperture 42. Bottom etchant pit 46 is having top wall 76 lying in the {100} plane and side walls 78, 80, 82 (not shown), and 84 (not shown) lying in the {111} planes. Side walls 78, 80, 82 and 84 are etched at an angle $\phi$ with respect to bottom planar surface 16 or the {100} planes in general.

Aperture plane 92 of aperture 40 is defined as a planar surface between protruding edges 94 and 96 of aperture 40. Protruding edge 96 is defined by the intersection of top etchant pit 20 with top wall 76 of bottom etchant pit 46. Protruding edge 94 is defined by the intersection of bottom etchant pit 46 with bottom wall 30 of top etchant pit 20. Aperture axis 98 of aperture 40 is shown perpendicular to aperture plane 92 midway between protruding edges 94 and 96. The angle of aperture Plane 92 with respect to top Planar surface 14, or the {100} planes in general, is herein designated as angle $\beta$.

Figure 3A:
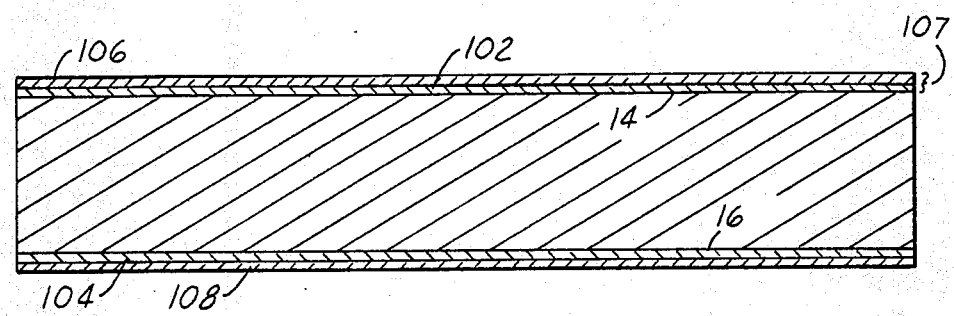
FIGS. 3A through 3C illustrate various process steps in fabricating the embodiment illustrated in FIG. 2.
Figure 3B:
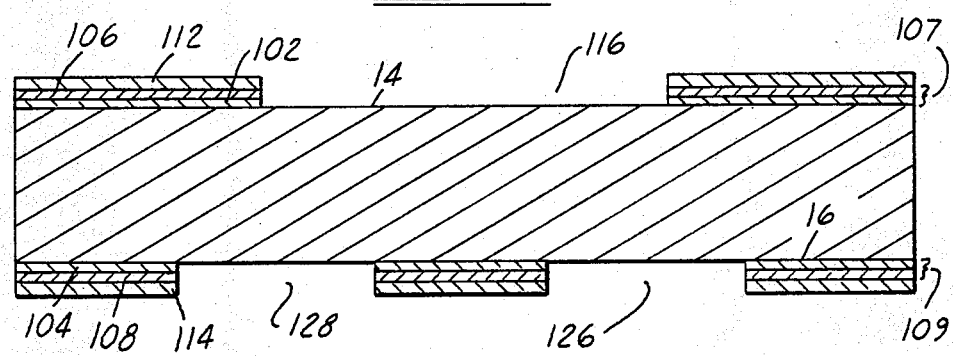
Figure 3C:
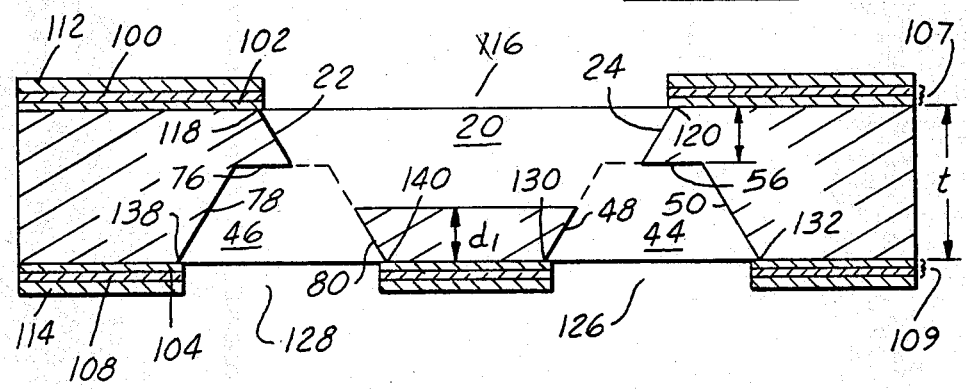

Referring now to FIGS. 3A through 3C, wherein like numerals refer to like parts shown in FIGS. 1 and 2, the fabrication of aperture assembly 10 is now described. The fabrication steps described herein utilize photolithographic and etching techniques well known in the microelectronics industry. Substrate 12 is illustrated in FIG. 3A as a silicon substrate, preferably having been sawed to a thickness of approximately 200 to 500 microns with major surfaces lying substantially in the {100} planes. Top and bottom silicon oxide layers 102 and 104, respectively, are grown on substrate 12 using conventional techniques well known in the semiconductor industry. Layer of silicon nitride 106 and layer of silicon nitride 108 are deposited over respective silicon oxide layers 102 and 104, respectively, using conventional vapor deposition techniques. Silicon oxide layer 102 and silicon nitride layer 106, together define passivation layer 107. Similarly, the combination of silicon oxide layer 104 and silicon nitride layer 108 define passivation layer 109.

With particular reference to FIG. 3B, photo-resist layers 112 and 114 are deposited over respective passivation layers 107 and 109. Rectangular etchant pattern 116 is delineated in photo-resist layer 112 by conventional photolithographic techniques. Rectangular etchant pattern 116 is etched through passivation layer 107 thereby exposing a corresponding rectangular portion of top planar surface 14 for etching top etchant pit 20 in a subsequent etching step. In a similar manner, bottom rectangular pattern 126 and bottom rectangular pattern 128 are delineated through bottom photo-resist layer 114 and passivtion layer 109.

Referring now to FIG. 3C, a wet anisotropic etchant solution such as aqueous-potassium-hydroxide solution or ethylene-diamine-pyrocatecol solution, is applied to top rectangular pattern 116, bottom rectangular pattern 126, and bottom rectangular pattern 128 to form respective top etchant pit 20, bottom etchant pit 44 and bottom etchant pit 46. For the {100} silicon wafer illustrated herein, the wet etchant acts against the {100} planes at a rate approximately 100 times greater than against the {111} planes. The etchant steps are timed such that top etchant pit 20 is etched against the {100} planes to a distance $d_1$ before bottom planar surface 16. Stated another way, top etchant pit 20 is etched to a depth $t-d_1$ where t is the thickness of substrate 12. During the etching of the planes to a distance of $d_1$, there will be relatively little etching against the {111} planes. Accordingly, sidewalls 22, 24, 26 (FIG. 1) and 28 (FIG. 1), which lie in the {111} planes, are slightly offset from rectangular pattern 116. More specifically, the intersection of sidewalls 22, 24, 26 and 28 with top planar surface 14 defines, respectively, left transverse edge 118, right transverse edge 120, longitudinal edge 122 (FIG. 1), and longitudinal edge 124 (FIG. 1) of etchant pit 20, all of which are slightly offset from rectangular pattern 116.

Both bottom etchant pit 44 and bottom etchant pit 46 are etched to a depth $d_2$ before top planar surface 14. That is, bottom etchant pit 44 and bottom etchant pit 46 are etched to a depth $t-d_2$. With respect to bottom etchant pit 44, the intersection of sidewalls 48, 50, 52 (not shown) and 54 (not shown) with bottom planar surface 16 defines, respectively, left transverse edge 130, right transverse edge 132, longitudinal edge 134 (not shown), and longitudinal edge 136 (not shown), all of which are slightly offset from rectangular pattern 126. Referring to bottom etchant pit 46, the intersection of sidewalls 78, 80, 82 (not shown) and 84 (not shown) with bottom planar surface 16 defines, respectively, left transverse edge 138, right transverse edge 140, longitudinal edge 142 (not shown), and longitudinal edge 144 (not shown), all of which are slightly offset from rectangular pattern 128.

Top etchant pit 20 and bottom etchant pits 44 and 46 are here shown etched to the same depth ($d_1 = d_2$) such that the etchant steps are performed concurrently. That is, by etching to the same depth, the timing of the etching steps is substantially the same thereby enabling the etching steps to be performed concurrently.

Figure 4:
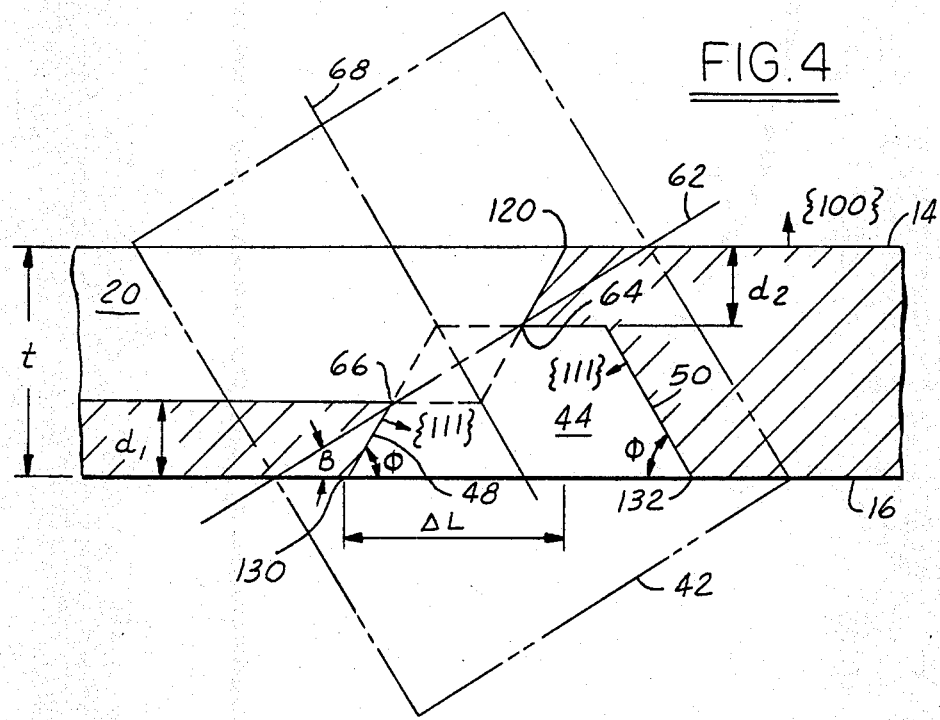
FIG. 4 is an expanded view of a portion of the embodiment illustrated in FIG. 2.

The trigonometric relationships of the various etching parameters described herein above with respect to the desired or preselected angle of the aperture plane is now described with reference to FIG. 4. For clarity of illustration, the following description is with particular reference to aperture 42. Those skilled in the art, however, will recognize that the description herein is also applicable to aperture 40, and is further applicable to other apertures desired by a designer which are not specifically illustrated herein. It is to be further noted that the description herein relates to a {100} silicon wafer. The teachings described, however, are applicable to other monocrystaline substrates such as, for example, {110} crystaline structures wherein the {111} planes intersect the planes at an angle of 90°.

As previously described herein with reference to FIG. 2, aperture plane 62 extends through protruding edges 64 and 66 forming angle $\beta$ with respect to bottom planar surface 16. Side walls 48 and 50 of etchant pit 44 lie along the {111} planes at an angle $\phi$ to the nominal {100} plane of 54.7°. Preselected angle $\beta$ is related to the longitudinal distance between left transverse edge 130 of bottom etchant pit and the opposing right transverse edge 120 of top etchant pit 20 ($\Delta L$), the preselected distance of top etchant pit 20 from bottom planar surface 16 ($d_1$), the preselected distance of bottom etchant pit 44 from top planar surface 14 ($d_2$), the angle between the {111} planes and the nominal {100} plane ($\phi$) and the thickness of substrate 12 (t) by the following trigonometric relation:

$$\tan^{-1}\left[\frac{t - (d_1 + d_2)}{\Delta L - \frac{(d_1 + d_2)}{\tan \phi}}\right]$$

Thus, it is seen that the preselected angle $\beta$ may be changed by the designer by changing any of the parameters shown in the above equation. The designer is therefore able to select a desired aperture angle by simply selecting from: the type of monocrystaline substrate ($\phi$); wafer thickness (t); longitudinal offset of opposing etchant pits ($\Delta L$); and the etchant time or thickness ($d_1 + d_2$)

This concludes the description of the preferred embodiment. The reading of it by those skilled in the art will bring to mind many alterations and modifications without departing from the spirit and scope of the invention. Accordingly it is intended that the scope of the invention be limited only by the following claims.

We claim:

1. A method for anisotropically etching an aperture into a monocrystaline substrate such that the angle of the aperture plane with respect to the nominal crystaline planes of the substrate may be preselected, said method comprising the steps of:
    dimensioning said substrate with top and bottom planar surfaces substantially parallel to said nominal crystaline planes, the spacing between said top and bottom planar surfaces being trigonometrically related to said preselected angle of said aperture plane;
    anisotropically etching a first etchant pit through said top planar surface and against said nominal crystaline planes to a preselected distance from said bottom planar surface which is trigonometrically related to said preselected angle of said aperture plane, said first etchant pit having plane surface sides along intersecting crystaline planes to said nominal crystaline planes, the intersection of said plane surface sides with said top planar surface defining a first pair of longitudinal edges and a first pair of transverse edges of said first etchant pit; and
    anisotropically etching a second etchant pit through said bottom planar surface and against said nominal crystaline planes to a preselected distance from said top planar surface which is trigonometrically related to said preselected angle of said aperture plane, a portion of said second etchant pit intersecting a portion of said first etchant pit to define said aperture, said second etchant pit having plane surface sides along said intersecting crystaline planes, the intersection of said plane surface sides with said bottom planar surface defining a second pair of longitudinal edges and a second pair of transverse edges of said second etchant pit, one of said second pair of transverse edges being longitudinally offset from an opposing one of said first pair of transverse edges by a preselected longitudinal offset trigonometrically related to said angle of said aperture plane, such that said angle of said aperture plane is greater than zero degrees.

2. The method recited in claim 1 wherein said preselected angle is trigonometrically related to said preselected longitudinal offset ($\Delta L$), said preselected distance of said first etchant pit from said second planar surface ($d_1$), said preselected distance of said second etchant pit from said first planar surface ($d_2$), the angle of intersection between said intersecting planes and said nominal planes ($\phi$), and said spacing between said top planar surface and said bottom planar surface (t) by the following trigonometric relation:

$$\tan^{-1}\left[\frac{t - (d_1 + d_2)}{\Delta L - \frac{(d_1 + d_2)}{\tan \phi}}\right]$$

3. The method recited in claim 2 wherein said substrate comprises a silicon substrate.

4. The method recited in claim 3 wherein said nominal crystaline planes comprise {100} planes and said intersecting crystaline planes comprise {111} Planes and said angle $\phi$ is approximately 54.7°.

5. The method recited in claim 4 wherein said plane surface sides of said first etchant pit and said second etchant pit are substantially pyramidal in shape.

6. The method recited in claim 3 wherein said nominal crystaline planes comprise {110} planes and said intersecting crystaline planes comprise {111} planes and said angle φ is approximately 90°.

7. The method recited in claim 2 wherein said preselected distance of said first etchant pit from said second planar surface (d₁) is substantially equal to said preselected distance of said second etchant pit from said first planar surface (d₂) whereby said first and second etchant pits are concurrently formed in a single etchant step.

8. A method for anisotropically etching an aperture into a monocrystaline substrate such that the angle of the aperture plane with respect to the nominal crystaline planes of the substrate may be preselected, said method comprising the steps of:
  dimensioning said substrate with top and bottom Planar surfaces substantially parallel to said nominal crystaline planes, the spacing between said top and bottom planar surfaces being trigonometrically related to said preselected angle of said aperture plane;
  anisotropically etching a first etchant pit through said top planar surface and against said nominal crystaline planes to a preselected distance from said bottom planar surface which is trigonometrically related to said preselected angle of said aperture plane, said first etchant pit having plane surface sides along intersecting crystaline planes to said nominal planes, the intersection of said plane surface sides with said top planar surface defining a rectangle having a left transverse edge, a right transverse edge and a pair of longitudinal edges; and
  anisotropically etching a second etchant pit through said bottom planar surface and against said nominal crystaline planes to a preselected distance from said top planar surface which is trigonometrically related to said preselected angle of said aperture plane, a portion of said second etchant pit intersecting a portion of said first etchant pit to define said aperture, said second etchant pit having plane surface sides along said intersecting crystaline planes, the intersection of said plane surface sides with said bottom planar surface defining a rectangle having a left transverse edge, a right transverse edge and a pair of longitudinal edges, said left transverse edge of said second etchant pit being longitudinally offset to the left of said right transverse edge of said first etchant pit by a preselected longitudinal offset trigonometrically related to said angle of said aperture plane and said left transverse edge of said second etchant pit being longitudinally offset to the right of said left transverse edge of said first etchant pit by a preselected longitudinal offset trigonometrically related to said angle of said aperture plane.

9. The method recited in claim 8 wherein said preselected distance of said first etchant pit from said second planar surface is substantially equal to said preselected distance of said second etchant pit from said first planar surface whereby said first and second etchant pits are concurrently formed in a single etchant step.

10. The method recited in claim 9 wherein said preselected angle is trigonometrically related to said preselected longitudinal offset (ΔL), said preselected distance of said first etchant pit from said second planar surface (d), the angle of intersection between said intersecting planes and said nominal planes (φ), and said spacing between said top planar surface and said bottom planar surface (t) by the following trigonometric relation:

$$\tan^{-1}\left[\frac{t - 2d}{\Delta L - \frac{2d}{\tan\phi}}\right]$$

11. The method recited in claim 8 for anisotropically etching a second aperture into said substrate such that the angle of said second aperture plane with respect to said nominal crystaline planes of said substrate may be preselected, said method further comprising the step of anisotropically etching a third etchant pit through said bottom planar surface and against said nominal crystaline planes to a preselected distance from said top planar surface which is trigonometrically related to said preselected angle of said aperture plane, a portion of said third etchant pit intersecting a portion of said first etchant pit to define said second aperture, said third etchant pit having plane surface sides along said intersecting crystaline planes, the intersection of said plane surface sides with said bottom planar surface defining a rectangle having a left transverse edge, a right transverse edge and a pair of longitudinal edges, said right transverse edge of said third etchant pit being longitudinally offset to the left of said right transverse edge of said first etchant pit by a preselected longitudinal offset trigonometrically related to said angle of said second aperture plane.

12. The method recited in claim 11 wherein said substrate comprises a silicon substrate.

13. The method recited in claim 12 wherein said nominal crystaline planes comprise {100} planes and said intersecting crystaline planes comprise {111} planes and said angle φ is approximately 54.7°.

14. The method recited in claim 13 wherein said plane surface sides of said first etchant pit and said second etchant pit are substantially pyramidal in shape.

15. The method recited in claim 12 wherein said nominal crystaline planes comprise {110} planes and said intersecting crystaline planes comprise {111} planes and said angle φ is approximately 90°.

* * * * *